United States Patent [19]

Tehori

[11] Patent Number: 4,605,916
[45] Date of Patent: Aug. 12, 1986

[54] TRANSVERSE ELECTROMAGNETIC CELLS ADAPTED FOR ELECTROMAGNETIC PULSE TESTING

[75] Inventor: Ahikam Tehori, Nahariya, Israel

[73] Assignee: State of Israel, Ministry of Defense, Rafael Armament Auth., Haifa, Israel

[21] Appl. No.: 592,101

[22] Filed: Mar. 22, 1984

[30] Foreign Application Priority Data

Feb. 3, 1984 [IL] Israel ........................................ 70865

[51] Int. Cl.$^4$ ........................... H01P 1/00; H01P 3/06
[52] U.S. Cl. .................................... 333/245; 333/260; 339/117 R
[58] Field of Search ................. 333/260, 245, 243, 12, 333/34; 339/177 R; 324/58 R, 58 C, 95

[56] References Cited

U.S. PATENT DOCUMENTS

| | | | |
|---|---|---|---|
| 2,786,184 | 3/1957 | Alford | 333/260 X |
| 2,943,275 | 6/1960 | Bittner et al. | 333/243 X |
| 3,027,514 | 3/1962 | Bird et al. | 333/260 X |
| 3,783,434 | 1/1974 | Ransford, III | 339/177 R X |

OTHER PUBLICATIONS

Ippalopalli, S., Chang D., Ma, M.: Characterization of Electrically Small Radiation Source by Tests Inside a Transmission Line Cell; NBS Technical Note 1017; Issued Feb. 1980; pp. 1, 2, 51.

Primary Examiner—Eugene R. LaRoche
Assistant Examiner—Benny Lee
Attorney, Agent, or Firm—Benjamin J. Barish

[57] ABSTRACT

A transverse electromagnetic (TEM) cell adapted for electromagnetic pulse (EMP) testing, comprises an adapter assembly at each of the tapered ends of the metal shielded enclosure for enabling the cell, including the connectors, to withstand the high voltage pulse of EMP testing while maintaining the continuity of the characteristic impedance. The adapter assembly at each end of the cell comprises outer and inner electrical conductors connected to the shielded enclosure and septum plate, respectively, and an insulating member which includes a first insulating section between the inner and outer conductors, and a second insulating section comprised of a plurality of inclined plates between the tapered end of the shielded enclosure and the septum plate. The adapter assembly at one end is to be connected either to an EMP generator or, with a slight modification, to a standard radio-frequency, continuous-wave generator; and the adapter assembly at the opposite end is to be connected to a load.

9 Claims, 5 Drawing Figures

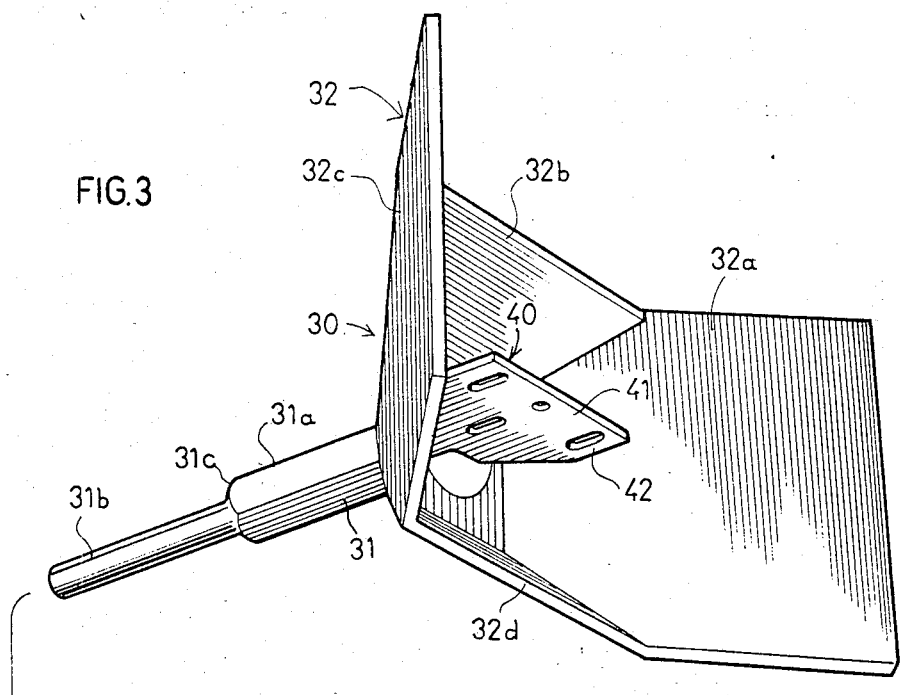
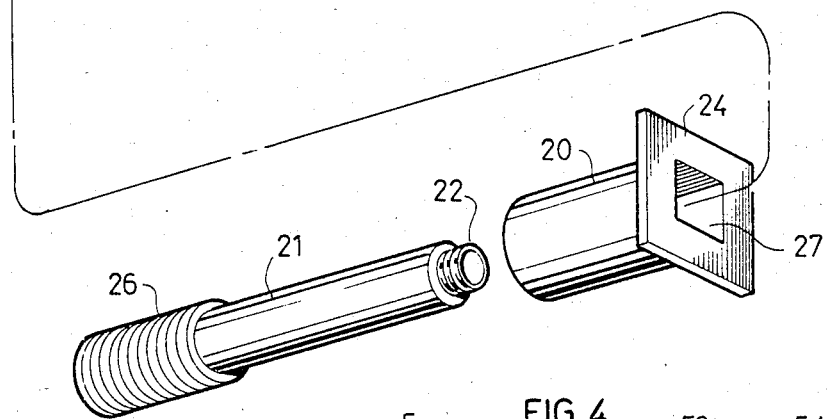
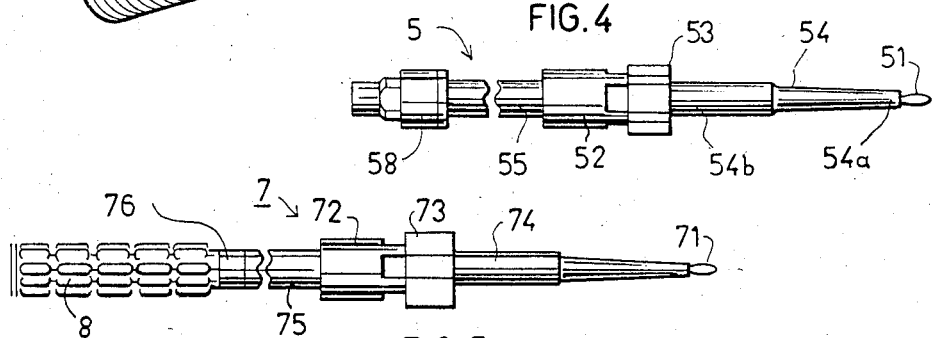

TRANSVERSE ELECTROMAGNETIC CELLS ADAPTED FOR ELECTROMAGNETIC PULSE TESTING

BACKGROUND OF THE INVENTION

The present invention relates to TEM (transverse electromagnetic) cells, such as are used for performing radiated electromagnetic (EM) susceptibility testing or for measuring radiated EM emissions from electronic or electromechanical equipment.

The standard TEM cell is a rectangular, coaxial line that serves as a broadband, linear phase and amplitude transducer, in the sense that it converts field strength to RF (radio-frequency) voltage or RF voltage to field strength. Such cells are commonly used either to establish standard electromagnetic (EM) fields for susceptibility testing of electronic equipment, or to detect radiated emanations from electronic equipment. Briefly, the cell includes an outer metal shielded enclosure for enclosing the equipment to be tested, which shielded enclosure is formed with tapered end sections at its opposite ends defined by a plurality of inclined walls; an inner metal septum plate extending along the longitudinal axis of the shielded enclosure; and a connector assembly connected to each of the two tapered ends of the shielded enclosure for connection to the cell generator and cell load, respectively. Further details of the construction and operation of such TEM cells are available in published literature, for example, in NBS Technical Note 1013, published by the National Bureau of Standards, titled "Using a TEM Cell for EMC Measurements of Electronic Equipment."

BRIEF SUMMARY OF THE INVENTION

An object of the present invention is to provide a TEM cell which may also be used for electromagnetic pulse (EMP) simulation, the latter being performed at the present time with other means and not with a standard TEM cell.

More particularly, an object of the present invention is to provide a TEM cell in which the connectors at the opposite ends of the cell are provided with adapters enabling the connectors to withstand the high-voltage pulse outputted by an EMP generator, while maintaining the continuity of the characteristic impedance required for the low VSWR (voltage-standing-wave ratio) in the standard continuous-wave (CW) tests to be performed by the TEM cell.

According to a broad aspect of the present invention, there is provided a TEM cell as described above, further characterized in that each of the connector assemblies includes: an outer electrical conductor connected to the respective tapered end of the shielded enclosure; an inner electrical conductor connected to the respective end of the septum plate; and an insulating member having a first insulating section extending between the inner and outer conductors of the connector assembly, and a second insulating section extending between the tapered end of the shielded enclosure and the septum plate.

More particularly, each tapered end of the shielded enclosure comprises a plurality (usually 4) of inclined walls. The second insulating section of the insulating member comprises a corresponding plurality (4) of insulating plates, each plate being joined at one end to the first insulating section of the insulating member, and extending therefrom substantially parallel to the inclined wall at the respective tapered end of the shielded enclosure. In the preferred embodiment of the invention described below, the four insulating plates of the insulating member are integrally formed, as by casting, with the first section of the insulating member.

As will be shown below, such a construction permits the TEM cell to be used not only for the standard TEM cell tests (i.e. for performing radiated EM susceptibility testing and for measuring radiated EM emissions from electronic or electromechanical equipment), but also for electromagnetic pulse (EMP) simulation while maintaining the required low VSWR required for the standard TEM cell tests.

Further features and advantages of the invention will be apparent from the description below.

BRIEF DESCRIPTION OF THE DRAWINGS

The invention is herein described, by way of example only, with reference to the accompanying drawings, wherein:

FIG. 3 is an exploded, three-dimensional view, of the high-voltage adapter assembly of FIG. 2;

FIG. 4 is a side elevational view illustrating the coaxial cable connector to be applied to the adapter assembly of FIGS. 2 and 3 at the generator end of the cell; and FIG. 5 is a side elevational view illustrating the coaxial cable connector to be applied to the adapter assembly of FIGS. 2 and 3 at the load end of the cell.

DESCRIPTION OF A PREFERRED EMBODIMENT

Figure 1:
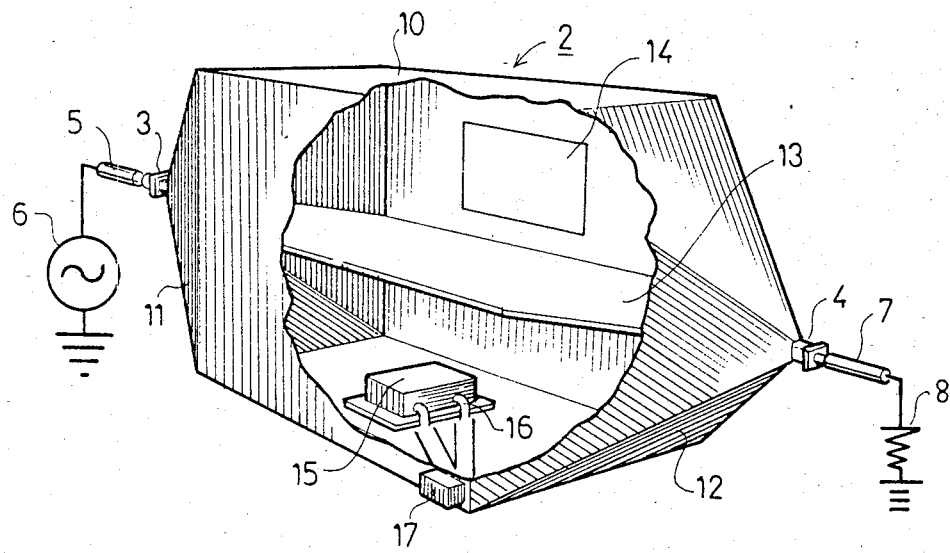
FIG. 1 schematically illustrates a standard TEM cell but modified in accordance with the present invention to make it compatible also for electromagnetic pulse (EMP) simulation.

FIG. 1 illustrates a standard TEM cell, generally designated 2, including adapter assemblies 3 and 4, respectively, at its opposite ends for adapting the cell for electromagnetic pulse (EMP) simulation. Thus, one adapter assembly 3 is adapted to receive a coaxial-conductor connector 5 for connecting that end of the cell to the voltage generator 6; and another adapter assembly 4 at the opposite end of the cell is adapted to receive a coaxial-conductor connector 7 for connecting that end of the cell to the load, schematically indicated as 8. Except for the adapter assemblies 3 and 4 at the opposite ends of the cell, the cell itself can be of standard construction, including a main enclosure 10 of rectangular section formed with tapered ends 11 and 12 and supporting a metal septum plate 13 extending longitudinally through the main enclosure section 10. The latter section is formed with an access window 14 to provide access into the interior of the cell. The equipment to be tested is schematically shown at 15 and is connected by leads 16, which may be covered by conductive tapes, to a filter box 17, so as to provide minimum exposure of the leads to the TEM field within the cell.

Figure 2:
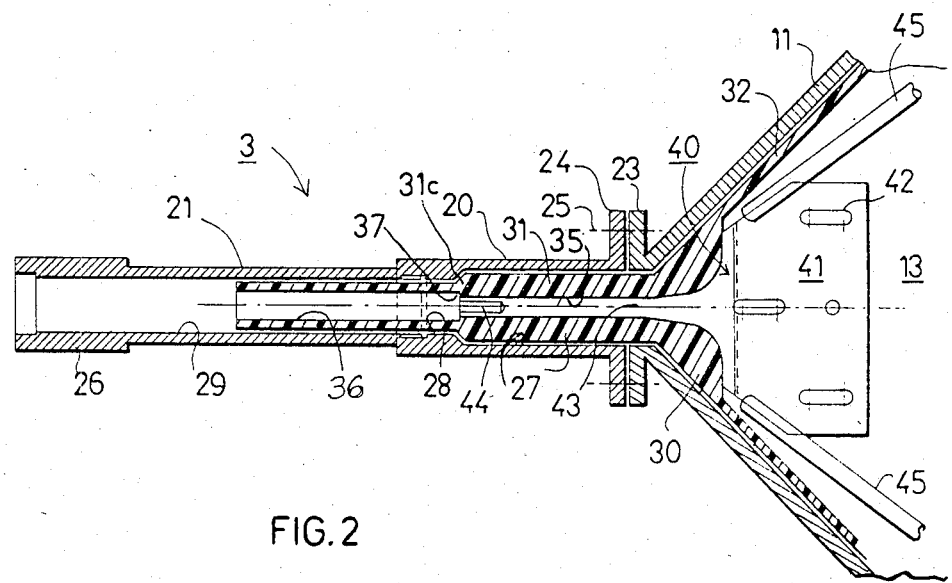
FIG. 2 is an enlarged, longitudinal sectional view, illustrating the construction of the high-voltage adapter assembly applied to both the generator and load ends of the cell of FIG. 1 to adapt the cell for EMP simulation.

Adapter assemblies 3 and 4 applied to the opposite tapered ends 11 and 12 of the cell 2 are of the same construction; the construction is illustrated in FIGS. 2 and 3 with respect to adapter assembly 3 at the generator end of the cell. Connector 5 at the generator end of the cell is more particularly illustrated in FIG. 4, and connector 7 at the load end of the cell is more particularly illustrated in FIG. 5.

Thus, the adapter assembly 3 illustrated in FIGS. 2 and 3 comprises two metal sleeves 20, 21 secured together by threads 22 (FIG. 3) formed in one end of sleeve 21 and receivable in threads formed in the corresponding end of sleeve 20. The two sleeves 20 and 21 together constitute the outer conductor of the adapter assembly, for connecting the outer conductor of the respective connector (5 or 7 in FIG. 1) to the respective tapered end (11 or 12) of the shielded enclosure 2.

For this purpose, each of the inclined end walls of the respective tapered end (11 in FIG. 2) of the shielded enclosure is formed with an upstanding flange 23 extending perpendicularly to the axis of the cell 2 and adapter assembly 3. The inner end of metal sleeve 20 is formed with a corresponding flange 24 around its periphery for securing, as by fasteners 25, to flanges 23 of the cell. In addition, the outer end of metal sleeve 21, at the opposite end of adapter assembly 3, is formed with external threads 26 for connection to the outer conductor of the connector (5 or 7, FIG. 1) to the generator 6 or load 8 at the respective end of the cell.

The inner end of metal sleeve 20 is formed with a bore 27 of square cross-section which merges, at the outer end of the sleeve, with a smaller-diameter bore 28 of circular cross-section. Metal sleeve 21, secured to sleeve 20, is formed with a bore 29 of circular cross-section of the same diameter as bore 28 of sleeve 20.

Adapter assembly 3 further includes an insulating member, generally designated 30, made of a unitary body of insulating material, as by casting. Insulating member 30 receives the inner conductor, generally designated 40, attached at one end to the metal septum plate 13 of the TEM cell 2, and connected at its opposite end to the inner conductor of the connector (5 or 7) at the generator 6 or load 8 end of the cell. This inner conductor 40 comprises a metal plate 41 formed with a plurality of openings 42 for adjustably fastening same to the metal septum plate 13 of the TEM cell 2 (FIG. 1), and a stem 43 extending through insulating member 30 and formed at its outer end with a socket 44 for receiving the inner conductor of the respective connector 5 or 7. The outer end of stem 43 is preferably of square section.

Insulating member 30 is constituted of two main section, namely: a first section 31 extending between the two outer metal sleeves 20, 21, constituting the outer conductor of the assembly, and metal stem 43 of the inner conductor 40; and a second insulating section 32 extending between the inner conductor 40 of the adapter assembly 3, and the inclined walls of the respective tapered end 11 of the TEM cell 2.

As shown particularly in FIG. 3, insulating section 32 is constituted of four insulating plates 32a–32d. Each plate is joined at its inner end to insulating section 31 and extends therefrom substantially parallel to one inclined wall at the respective tapered end 11 of the shielded enclosure 10.

Section 31 of the insulating member 30 is formed with an inner portion 31a (FIG. 3) of square cross-section for reception in square bore 27 of metal sleeve 20, and with an outer portion 31b of circular cross-section for reception within bore 28 of sleeve 20 and bore 29 of sleeve 21. Outer portion 31b is of smaller outer diameter than inner portion 31a, and provides an annular shoulder 31c engageable with the juncture of bores 27 and 28 in sleeve 20, thereby fixing the position of insulating member 30 within sleeves 20 and 21. Section 31 of insulating sleeve 30 is further formed with a bore 35 of square cross-section for receiving stem 43 of the inner conductor 40, the outer end of the bore being enlarged and of circular cross-section, as shown at 36, for receiving the inner conductor of the respective connector, 5 or 7 (FIG. 1), as will be described more particularly below. The juncture 37 between bores 35 and 36 provides an annular shoulder for fixing the position of the inner conductor in the coaxial connector when attached to the adapter assembly.

As shown in FIG. 2, the edges of the metal septum plate 13 are tapered inwardly at their ends fastened to the metal plate 41 such that the space between the edges of the septum plate and the tapered end 11 of the shielded enclosure (with the section 32 in between) decreases towards the juncture of the septum plate with the metal plate. An insulating rod 45 is applied to each of the inner edges of the septum plate 13 in order to increase the insulation between it and the tapered end 11 of the shielded enclosure. Each insulating rod 45 may be of cylindrical section formed with an axially-extending slot for receiving the edge of the septum plate 13, and may have a length of about 30 cm., after which the space between the edge of the septum plate 13 and the tapered end 11 of the enclosure would be sufficient to provide the required insulation.

FIG. 4 illustrates connector 5 to be applied to the illustrated adapter assembly 3 at the generator end of the cell. Connector 5 includes an inner conductor 51 adapted to be received within socket 44 of the inner conductor 40 in the adapter assembly 3 illustrated in FIGS. 2 and 3, and an outer conductor 52 adapted to be connected to metal sleeve 21 via a connector 53 threadable on threads 26 of sleeve 21. The inner conductor 51 is insulated from the connector 53 and the outer conductor 52 by an insulating layer 54 having an end portion 54a of reduced outer diameter for reception within bore 36 of insulating member 30, and a larger diameter portion 54b for reception within bore 29 of metal sleeve 21. The inner conductor 51 and the outer conductor 52 of connector 5 are connected to the respective terminals of the generator 6 (FIG. 1) by a coaxial cable 55.

When the adapter assembly 3 is to be connected to a standard continuous-wave (CW) radio-frequency (RF) generator, the coaxial cable 55 is connected to a connector 58 for connection to the generator; however, when adapter assembly 3 is to be used with an electromagnetic pulse (EMP) generator, connector 58 is omitted, and the coaxial cable 55 is connected directly to the EMP generator.

Connector 7 at the load end of the TEM cell 2 (FIG. 1) is of similar construction as connector 5 at the generator end, except that connector 7 terminates in the load 8 which is carried by the connector as a built-in unit. Thus, connector 7 also includes: the inner conductor 71 for reception within socket 44 of the respective adapter assembly (4, in FIG. 1); an outer conductor 72 threadedly attachable via connector 73 to threads 26 of metal sleeve 21 of the respective adapter assembly 4; and an insulating layer 74 between the two conductors 71 and 72. In this case, however, the coaxial conductors 71 and 72 are connected by cable section 75 to a plurality of discrete resistors constituting the load 8. The resistors are connected together to form a high voltage 50 ohm load and include an electrical output lead 76 for measuring the current through the load.

As one example, an adapter assembly, such as illustrated in the drawings was constructed to withstand pulses up to 70 kV when operating in the EMP mode while maintaining a low VSWR of less than 1.2, for a frequency range of DC to 100 mhz in the CW mode. In the EMP mode, there was used an EMP generator outputting an exponential pulse with rise time of less than 10 nsec, a decay time of 200 nsec, and a peak electric pulse up to 70 kV. The electric field within the cell had a peak value of 80 kV/m with a rise time of less than 10 nsec. The output cable from the generator was an RG-17 coaxial cable designed to match the impedance of the coaxial adapter assembly at the generator end of the TEM cell. The load 8 consisted of a serial-parallel combination of discrete resistors at the end of an RG-17 coaxial cable connected to form a high-voltage 50-ohm load. The insulating member 30, and the insulating rods 45 along the edges of the metal septum plate 13 were both of an epoxy resin.

While the invention has been described with respect to one preferred embodiment, it will be appreciated that many other variations, modifications, and applications of the invention may be made.

What is claimed is:

1. A transverse electromagnetic (TEM) cell adapted for electromagnetic pulse (EMP) testing, comprising: an outer metal shielded enclosure for enclosing the equipment to be tested and having a longitudinal axis and opposite tapered ends each defined by a plurality of inclined walls; an inner metal septum plate extending along the longitudinal axis of the shielding enclosure; and a respective connector assembly connected to each of the two tapered ends of the shielded enclosure for connection to a generator and a load, respectively; each of said connector assemblies comprising; an outer electrical conductor connected to a respective tapered end of the shielded enclosure; an inner electrical conductor connected to a respective end of the septum plate; and an insulating member having a first insulating section extending between the inner and outer conductors of the connector assembly, and a second insulating section extending between the tapered end of the shielded enclosure and the septum plate; said second insulating section of the insulating member comprising a plurality of insulating plates, one for each of said plurality of inclined walls, each plate being joined at one end to said first insulating section of the insulating member and extending therefrom substantially parallel to its respective inclined wall at the respective tapered end of the shielded enclosure.

2. The cell according to claim 1, wherein each tapered end of the shielded enclosure comprises four inclined walls, which tapered ends terminate in flanges extending perpendicularly to the axis of said shielded enclosure, said outer conductor of each connector assembly being formed with a complementary flange around its periphery which is connected to the respective flanges of the shielded enclosure.

3. The cell according to claim 1, wherein said plurality of insulating plates of said insulating member are integrally formed with said first section of said insulating member.

4. The cell according to claim 1, wherein said outer electrical conductor includes a metal sleeve having a bore therethrough for receiving the inner conductor of the connector assembly, one end of said bore being of square cross-section, the first insulating section of the insulating member including an insulation portion of square cross-section received within said bore.

5. The cell according to claim 4, wherein the end of said bore opposite to said one end in said metal sleeve is of circular cross-section, the end of the first section of the insulating member corresponding to said opposite end of said bore also being of circular cross-section.

6. The cell according to claim 5, wherein said outer electrical conductor of the connector assembly includes a second metal sleeve attached to the said opposite end of said first-mentioned metal sleeve, said second metal sleeve being formed with a bore therethrough of circular cross-section for receiving said circular-cross-section end of the first section of the insulating member.

7. The cell according to claim 1, wherein in each connector assembly said inner electrical conductor comprises a connector plate formed with a plurality of fastener openings for attachment to the septum plate of said shielded enclosure; the second insulating section of the insulating member being disposed between said connector plate and the respective tapered end of the shielded enclosure; said connector plate further including a stem passing through both sections of the insulating member for connection to a respective inner conductor of a coaxial cable.

8. The cell according to claim 7, wherein one end of said stem is of square cross-section and is received within a bore of square cross-section formed through said insulating member.

9. The cell according to claim 8, wherein said stem is formed with a bore for receiving the inner conductor of a coaxial cable connector.

* * * * *